United States Patent
Andreev et al.

(10) Patent No.: US 7,389,484 B2
(45) Date of Patent: Jun. 17, 2008

(54) METHOD AND APPARATUS FOR TILING MEMORIES IN INTEGRATED CIRCUIT LAYOUT

(75) Inventors: Alexandre Andreev, San Jose, CA (US); Andrey Nikitin, Moscow (RU); Ilya V. Neznanov, Moscow (RU); Ranko Scepanovic, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 276 days.

(21) Appl. No.: 11/280,879

(22) Filed: Nov. 16, 2005

(65) Prior Publication Data

US 2007/0108961 A1    May 17, 2007

(51) Int. Cl.
*G06F 17/50* (2006.01)
(52) U.S. Cl. .................... 716/9; 716/7; 716/8; 716/10
(58) Field of Classification Search ............... 716/9, 716/8, 7, 10, 18; 324/111
See application file for complete search history.

(56) References Cited

U.S. PATENT DOCUMENTS

| | | | |
|---|---|---|---|
| 6,553,552 B1 * | 4/2003 | Khan et al. .................... 716/10 |
| 6,735,754 B2 * | 5/2004 | Mehrotra et al. ............. 716/13 |
| 6,738,953 B1 * | 5/2004 | Sabharwal et al. ............ 716/1 |
| 6,775,200 B1 * | 8/2004 | Khan et al. ............ 365/230.03 |
| 2003/0076534 A1 * | 4/2003 | Li et al. .................... 358/1.16 |

* cited by examiner

*Primary Examiner*—Sun J. Lin
(74) *Attorney, Agent, or Firm*—Westman Champlin & Kelly

(57) ABSTRACT

A process and apparatus are provided for tiling objects, such as design memories, in one or more respective object locations in a layout pattern. For each object, the following steps are performed recursively based on a comparison of at least one of a capacity and a width of the object and that of the respective object location: (1) do nothing; (2) reconfigure the object to have a different capacity and/or width; and (3) split the object into two or more separate objects. The recursion is repeated for each reconfigured object and each separated object.

20 Claims, 8 Drawing Sheets

60 ↘

| NAME | TYPE (1rw, 1r1w, 2rw, etc.) | CAPACITY (# Words) | TYPE (# bits) | NUMBER OF INSTANCES | MAPPING TYPE |
|---|---|---|---|---|---|
| Memory_A | 2rw | 512 | 20 | 40 | ? |
| Memory_B | 1rw | 1k | 36 | 4 | ? |
| | | | | | |
| | | | | | |

| NAME | TYPE (1rw, 1r1w, 2rw, etc.) | CAPACITY (# Words) | TYPE (# bits) | NUMBER OF INSTANCES | MAPPING TYPE |
|---|---|---|---|---|---|
| Memory_A_1 | 2rw | 512 | 20 | 30 | SDM |
| Memory_A_2 | 2rw | 512 | 20 | 10 | RCELL |
| Memory_B | 1rw | 1k | 36 | 4 | RRAM |
| | | | | | |

FIG. 3B

METHOD AND APPARATUS FOR TILING MEMORIES IN INTEGRATED CIRCUIT LAYOUT

CROSS-REFERENCE TO RELATED APPLICATIONS

The present application is related to U.S. application Ser. No. 10/990,589, filed Nov. 17, 2004, issued as U.S. Pat. No. 7,155,688 and entitled "MEMORY GENERATION AND PLACEMENT".

FIELD OF THE INVENTION

The present disclosure relates to semiconductor integrated circuits. More particularly, the present disclosure relates to mapping memories instantiated in an integrated circuit design to an integrated circuit layout pattern.

BACKGROUND OF THE INVENTION

Several types of integrated circuits have been developed that have modules or blocks of transistors that are partly fixed and partly programmable and/or customizable. For example, a base platform for an integrated circuit can include basic sets of memories of a predetermined type.

If the design created by the IC designer contains user-defined memories, these memories are mapped into one or more of the pre-defined memory locations on the base platform. However, due to the variety of customer designs and the limited resources of a particular base platform or set of platforms, the process of selecting a suitable platform and mapping user-defined memories to the platform can be complex.

Processes and apparatus are therefore desired for assisting designers in mapping memory to integrated circuit layout patterns.

SUMMARY OF THE INVENTION

One embodiment of the present invention is directed to a process including a process of tiling objects in one or more respective object locations in a layout pattern, the process comprising: (a) for each object, recursively performing at least one of the following steps on the object based on a comparison of at least one of a capacity and a width of the object and that of the respective object location: (1) do nothing; (2) reconfigure the object to have a different capacity and/or width; and (3) split the object into two or more separate objects; and (b) repeating step (a) for each reconfigured object and each separate object generated in steps (a)(2) and (a)(3).

Another embodiment of the present invention is directed to a process of tiling design memories comprising: (a) receiving a database of design memory instances that can be instantiated in a layout pattern comprising respective memory features; (b) for each instance, recursively performing at least one of the following steps on the instance based on a comparison of at least one of a capacity and a width of the instance and that of the respective memory feature: (1) do nothing; (2) reconfigure the instance to have a different capacity and/or width; and (3) split the instance into two or more separate instances; and (c) repeating step (b) for each reconfigured instance and each separate instance generated in steps (b)(2) and (b)(3).

Another embodiment of the present invention is directed to a computer-readable medium comprising instructions which, when executed on a computer perform the following steps: (a) inputting a database of design memory instances; (b) inputting a database comprising predefined features of a base platform slice to which the instances can be mapped; (b) for each instance, recursively performing at least one of the following steps on the instance based on a comparison of at least one of a capacity and a width of the instance and that of a respective one of the features: (1) do nothing; (2) reconfigure the instance to have a different capacity and/or width; and (3) split the instance into two or more separate instances; and (c) repeating step (b) for each reconfigured instance and each separate instance generated in steps (b)(2) and (b)(3).

BRIEF DESCRIPTION OF THE DRAWINGS

FIG. 3 is a diagram illustrating a memory table.

DETAILED DESCRIPTION OF ILLUSTRATIVE EMBODIMENTS

Figure 1:
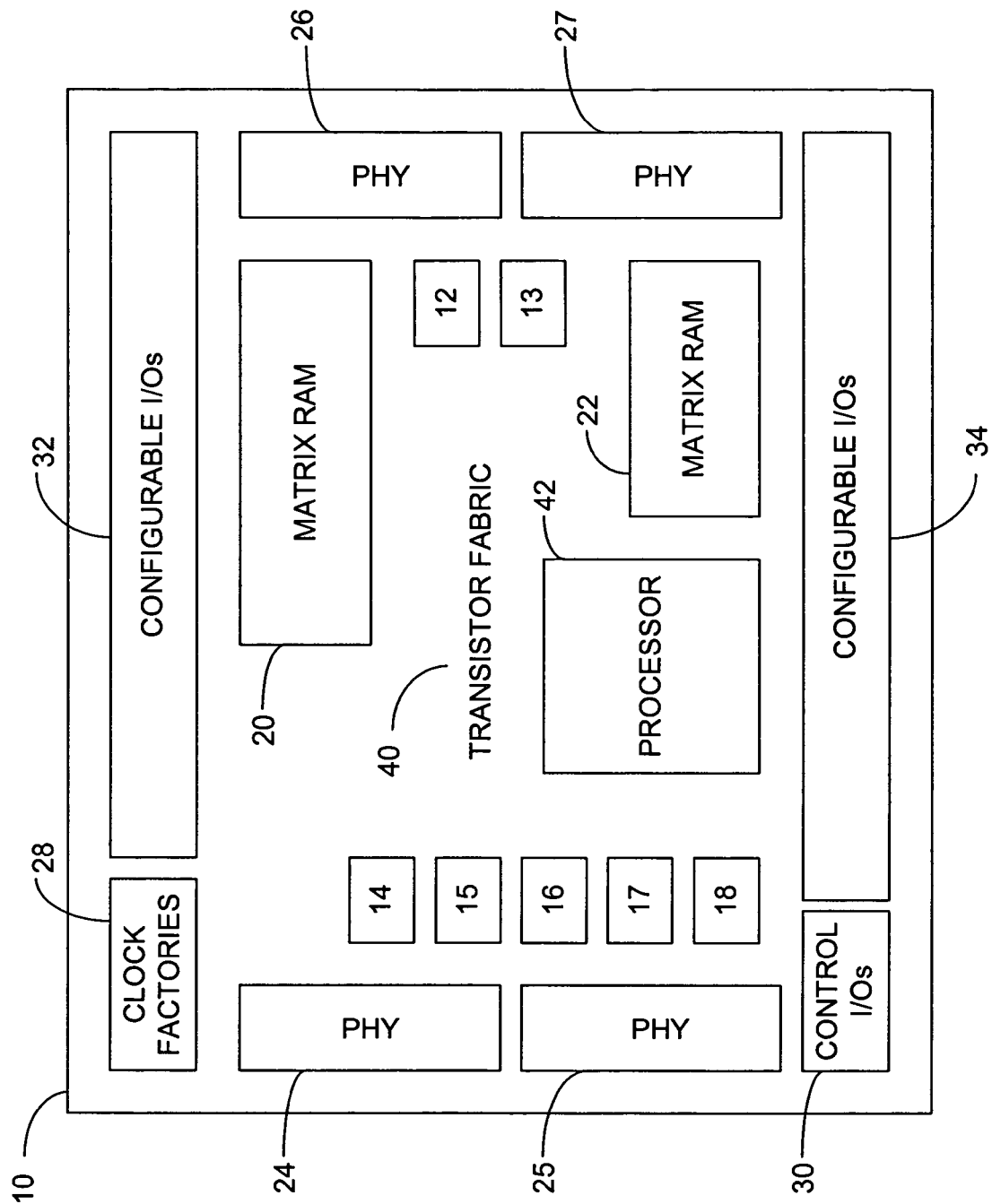
FIG. 1 is a simplified, schematic block diagram of a semiconductor slice.

Integrated circuits are generally fabricated on a thin silicon wafer or substrate. Semiconductor devices and electrical interconnections that form the integrated circuit are conventionally made by building many mask layers on top of one another on the substrate. Each successive mask layer may have a pattern that is defined using a mask. A mask has a shape used for patterning features in a particular process step during fabrication. The mask layers are fabricated through a sequence of pattern definition steps using the masks, which are interspersed with other process steps such as oxidation, etching, doping and material deposition. When a mask layer is defined using a mask chosen or provided by a customer, the mask layer is programmed or customized.

The lowest, "base" layers include the active areas of the semiconductor devices, such as diffusion regions and gate oxide areas, and desired patterns of the polysilcon gate electrodes. One or more metal and insulating layers are then deposited on top of the base layers and patterned to form conductive segments, which interconnect the various semiconductor devices formed in the base layers. Electrical contacts or vias are formed to electrically connect a conductive segment of one of the metal layers with a conductive segment or semiconductor device on one of the other layers on the wafer.

Several types of integrated circuits have been developed that have modules or blocks of transistors that are partly fixed and partly programmable and/or customizable. The utility of these modular chips is determined by factors such as complexity, cost, time, and design constraints to create functional electronics from these generic blocks of transistors. Field Programmable Gate Array (FPGA) refers to a type of logic chip in which all mask layers are pre-fabricated by an ASIC vendor and has a function that can be easily reprogrammed in the field with trivial modifications. FPGAs, however, are very large and have relatively high cost per function, relatively low speed, and high power consumption. An application specific integrated circuit (ASIC) is an integrated circuit designed specifically for a particular application or use. In a fully programmable ASIC, all mask layers are programmed or customized by the logic designer. A typical example of a fully programmable ASIC is a cell-based ASIC (CBIC). While a fully programmable ASIC efficiently uses power and area as compared to FPGAs, it is very complex to design and prototype. In a semi-programmable ASIC, some, but not all, mask layers are programmable. For example, some or all of the base layers are pre-fabricated by the ASIC vendor and the remaining layers, such as the metal layers, are programmed by the logic designer to interconnect the semiconductor elements to perform the desired function. A typical example of a semi-programmable ASIC is a gate-array-based ASIC. A semi-programmable ASIC can combine the high-density, high-performance benefits of standard-cell ASICs with the fast time-to-market and customization benefits of FPGAs.

Accordingly, semi-programmable ASICs have recently become more popular. Integrated circuit foundries have begun to develop standard, or base, platforms, known as "slices" comprising the base layers of an integrated circuit but without the metal interconnection layers. The base layers are patterned to form gates that can be configured into cells using tools supplied by the foundry. The chip designer designs additional metal layers for the base platform to thereby configure the integrated circuit into a custom ASIC employing the customer's intellectual property. An example of such configurable base platform is the RapidChip® Platform available from LSI Logic Corporation of Milpitas, Calif. The RapidChip® platform permits the development of complex, high-density ASICs with significantly reduced design and manufacturing risks and costs.

The design effort for a semi-programmable integrated circuit encompasses several stages. After the chip size has been selected and the input-output (I/O) cells have been placed in a layout pattern for the base platform, megacells, including memories and other large hard macros (hardmacs), are placed. Thereafter, standard cells are placed to complete the chip design.

An embodiment of the present invention is directed to a method and apparatus for mapping memories of a customer design to an integrated circuit layout pattern, such as the layout pattern of an integrated circuit having modules or blocks of transistors that are partly fixed and partly programmable and/or customizable. For example, a base platform for an integrated circuit can include basic sets of memories of a predetermined type such as RRAMs. RRAMs are sets of memory of the same type that are placed compactly and have built-in testing and self-repairing capabilities. The base platform might also contain single diffused memories, rcell memories and/or flip-flop rcell memories defined within the transistor fabric of the base platform, for example.

Single-diffused memories are memories that are prediffused on the base platform slice. For example, a base platform can include arrays of fixed random access memory (RAM). Each RAM instance is self-contained and can have its own built-in self-test (BIST) circuitry, decoupling capacitances and hard macro that snaps to locations in the layout floorplan. In some base platforms, RAM resources are consolidated in a number of small regions called RRAM matrices to share overhead and reduce area wastage. An example of a memory matrix is described in U.S. application Ser. No. 10/875,128, filed Jun. 23, 2004, issued as U.S. Pat. No. 7,168,052 and entitled YIELD DRIVEN MEMORY PLACEMENT SYSTEM, and U.S. Pat. No. 6,084,811 entitled PROCESS FOR LAYOUT OF MEMORY MATRICES IN INTEGRATED CIRCUITS.

An RCELL is a basic unit within the transistor fabric. An RCELL is made up of "N" and "P" type transistors. RCELLS are generally diffused in a regular pattern throughout the slice and are arranged to implement efficiently both memory and logic structures. The RCELLS are configured by interconnecting the various components through multiple layers of metal to allow for the creation of logic functions.

Flip-flop rcell memories are memories that are built from flip-flops and logical cells. Flip-flop rcell memories are often used for mapping memories having a very small number of words. Other memory types can also be used in alternative embodiments.

In one exemplary embodiment of the present invention, a universal memory mapping tool is provided, which maps memories of a customer design to RRAMS, single diffused memories, rcell memories, rcell flip-flop memories, and/or a combination of these memories on a selected base platform slice. For example, the universal memory mapping tool can be incorporated into an overall IC design system, such as LSI Logic's RapidWorx® design system or other design systems.

FIG. 1 is a diagram, which schematically illustrates a layout pattern for a base platform slice 10 of a partially manufactured semiconductor device on which the base wafer layers up to the connectivity layers have been fabricated. Slice 10 includes a base semiconductor wafer onto which hardmacs and other semiconductor devices have been diffused into the semiconductor layers. Diffusing a semiconductor wafer to create a hardmac simply means that during fabrication of the wafer layers, transistors or other electronic devices have been particularly and permanently embedded or otherwise arranged in the wafer layers to achieve specific functions, such as single diffused memories 12-18, RRAM matrices 20 and 22, data transceiver hardware such as I/O PHYs 24-27, clock factories including phase locked loops (PLLs) or delay locked loops (DLLs) 28, control I/Os 30, and configurable input/output (I/O) hardmacs 32 and 34.

The slice further includes a gate array of transistors, called transistor fabric 40, for further development. Transistor fabric 40 is an array of prediffused transistors in a regular pattern that can be logically configured by configuring the metal layers interconnecting the transistors by a suite of generation tools. For example, the tools may be used place one or more, and typically thousands, of cells onto the transistor fabric from a cell library. A cell refers to the personalization of the interconnect layers that instantiate a logic gate of the transistor fabric. For example, rcell memories and/or rcell flip-flop memories can be instantiated within the transistor fabric 40. A typical slice 10 also includes an embedded processor 42 that may be connected to other components of the slice.

The slice definition thus is a detailed listing of all the features available on the slice, such as the available transistor fabric and memory, a specification of a processor, processing element or processing circuit, the available configurable and/or hardmac I/O, an internal bus specification, any requirements of the available features, the cost of the slice, the ideal performance that can be expected of the slice, the expected power consumption, and other functional requirements, for example. The base platform for slice 10 may also include the contact mask and some of the fixed higher layers of connectivity for distribution of power, ground, and external signal I/O.

The slice 10 shown in FIG. 1 is only one example of a slice and its components. Other sets of features can be diffused into the base layers in alternative embodiments of the present invention. Different slices may contain different amounts of transistor fabric, different amounts and types of diffused and/or compiled memories, different types of fixed and configurable I/O blocks, different types and amounts of I/O hardmacs, processors, clocks, etc., depending upon the purpose of the final integrated circuit.

The slice itself can be defined by register transfer logic (RTL) or a netlist, for example. The collection of RTL logic is categorized into "shells" and can include a documentation shell, a verification shell, a synthesis shell, a static timing analysis shell, and a manufacturing test shell, all of which provide input and/or contain output from one or more of the design tools. The RTL shell provides a logical description of an aspect of the slice or of the generated or used resources. The documentation shell may be considered as the functional description of the resources. The verification shell is the functional verification description, whereas the synthesis shell may be thought of as the generation description. The static timing analysis shell is the timing description, the manufacturing test shell is the test description, and the floorplan shell is a description of the location of the slice resources. Additional shells may include the floorplan shell and the RTL qualification shell.

Figure 2:
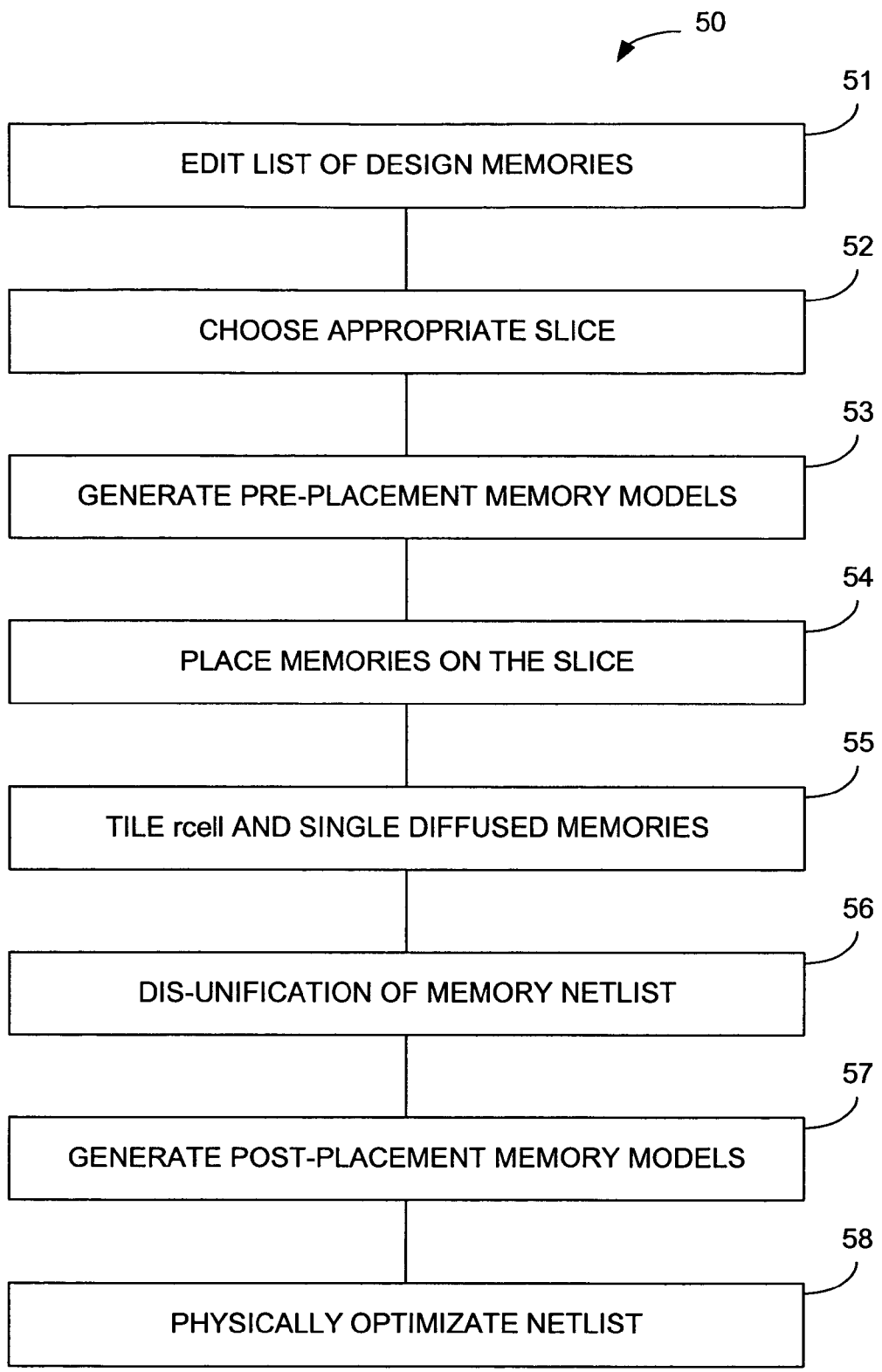
FIG. 2 is a flow chart illustrating steps performed by a universal memory tool.

FIG. 2 is a flow chart illustrating steps performed by a universal memory tool 50 for mapping a variety of customer memories to an integrated circuit layout pattern according to one embodiment of the present invention. The tool can be used for any integrated circuit technology, such as fully or semi-programmable application specific integrated circuits (ASICs), the base platform slices discussed above, Field-Programmable Gate Arrays (FPGAs), etc.

In the example shown in FIG. 2, universal memory tool 50 performs steps 51-58. However in alternative embodiments of the present invention, one or more of these steps can be eliminated or performed in a different order than that shown in FIG. 2. The universal memory tool can include one or more subcomponents for performing the various steps 51-58. Each tool or tool subcomponent preferably provides the designer with a graphical user interface (GUI) that shows a graphical representation of a selected, standardized, customizable integrated circuit design with predefined memory locations, transistor fabric and memory mapping into the memory locations. The user interface preferably allows the designer to see and edit customer memory lists, and to see utilization of predefined memory in the selected design. The designer can enter customer design information with the interface and load and store associated file data. The designer can preferably also manually move the memories among and within the predefined memory locations, and launch various routines for performing steps 51-58.

1. Editing List of Design Memories

At step 51, the designer edits a list of memory instantiated within the customer design. The designer inputs each design memory in a corresponding table or list. The memory data can be input manually by the customer or automatically extracted by a memory editing tool from the customer design database. In one embodiment, the design memory table includes the following memory parameters: name, type (1rw, 1r1w, 2rw), capacity (number of words), type (number of bits), number of instances of the given memory in the design, and mapping type (RRAM, SDM, rcells, flip-flop rcells, etc.) One line of the table corresponds to one memory model. FIG. 3 is a diagram illustrating a memory table 60 according to one embodiment of the present invention. In this example, there are two types of design memories, named Memory_A and Memory_B. Memory_A has 40 instances, and Memory_B has 4 instances. At this point in the procedure, the memories are not yet mapped, so the mapping type column in FIG. 3A is undefined.

After the designer has inputted memory table 60, the designer may run a fast-fit algorithm, to determine if the given set of design memories listed in memory table 60 fits the selected base platform slice. If the given set of design memories fits the slice, then the fast-fit algorithm will propose the best way of mapping the memories in each line of table 60 to RRAMs, SDMs, rcells, or flip-flop rcells, if the slice contains any RRAMs or SDMs or space for RCELL memories. All memories of one configuration should be mapped in the same way (of the four available ways: RRAM, SDM, RCELL memory, or flip-flop RCELL memory).

In some cases, one line of the memory table may contain a large number of instances, so that these memories cannot be mapped in the same way on the slice. For example in table 1, Memory_A has 40 instances. If the slice has locations for 30 single diffused memories and enough space for mapping 10 instances of "Memory_A" to rcells, the slice does not contain enough resources for mapping all 40 instances to single diffused memories or for mapping all 40 instances to rcells. In this case, the fast-fit algorithm cannot map all 40 memory instances of Memory_A of the table line in the same way. Therefore, the fast-fit algorithm proposes to the designer that this table line be split into two lines: "Memory_A_1" with 30 instances mapped to single diffused memories and "Memory_A_2" with 10 instances mapped to rcells.

The fast-fit algorithm therefore allows one memory configuration ("Memory_A") to be manually or automatically split into two or more memory configurations ("Memory_A_1" and "Memory_A_2") so that the total number of instances in these new configurations equals the number of memory instances of the original memory configuration. FIG. 3B illustrates memory table 60 after memory module, Memory_A, has been split into two lines, Memory_A_1 and Memory_A_2. The act of splitting Memory_A to Memory_A_1 and Memory_A_2 copies one memory configuration into two lines of the memory table. The fast-fit algorithm then proposes the best way of mapping the memories in each line of table 60 to RRAMs, SDMs, rcells, or flip-flop rcells and enters the proposed mapping type into table 60. In this example, the instances of Memory_A_1 will be mapped to SDMs, the instances of Memory_A_2 will be mapped to rcells, and the instances of Memory_B will be mapped to an RRAM matrix. The designer can accept the proposed mapping or modify the mapping manually through the graphical user interface.

2. Choosing the Appropriate Slice

The designer may manually set the manner in which each line of the memory table is mapped, and can check whether the given set of memories that have been mapped manually fits the slice, at step 52 in FIG. 2. The memory editing tool allows the designer to view the list of available slices and check which slices are suitable for mapping the given set of memories. The designer can also choose the best slice of this list, wherein the "best slice" is the slice that fits the memory list and has as small of a size as possible or has the greatest memory utilization, for example.

3. Generate Pre-Placement Memory Models

At step 53, the designer executes a memory model generation tool for creating pre-placement models of each memory configuration (line) in the memory table. Each memory model can include, for example, timing models, layout models and models for simulation. In one embodiment, the pre-placement memory models are generated after the memory table has been created completely. For example, in one embodiment, the memory model generation tool generates a Verilog physical description, Verilog for memory simulation and Verilog timing models for each memory configuration. The pre-placement timing models can be created based on any suitable methodology. In one embodiment, the timing models are created as models of the worst case (e.g., the timing model corresponding to the worst case mapping of a customer memory to an RRAM/SDM/rcell). The memory model generation tool obtains the worst case timing model by examining all possible ways of mapping the given memory to an RRAM, SDM or set of rcells, for example. The tool then chooses the worst case timing model.

When generating layout models for each memory configuration, the memory model generation tool generates a physical description of a virtual memory with a dummy layout. For example, the dummy layout can define a generic outline for that memory configuration and generic pin positions.

In U.S. Ser. No. 10/990,589, filed Nov. 17, 2004, issued as U.S. Pat. No. 7,155,688 and entitled "MEMORY GENERATION AND PLACEMENT," all memories of each configuration have the same layout (outline and pin positions). Since it is possible for each instance to be mapped to RRAMs in a different manner (with different pin positions), the memory model generation tool disclosed in this application generates a virtual memory with virtual buffers connected to each pin of each memory. Precise coordinates are assigned to the virtual buffers. Although the generic pin positions of the memory model do not adequately reflect the reality of a particular memory instance, the locations of the virtual buffers provide a coffection to this inadequacy. However, since the number of virtual buffers is equal to the number of ports in the memory, the resulting memory model can include a huge number of virtual buffers.

One embodiment of the present invention avoids using these virtual buffers. Generic models for each memory configuration are generated as described above, except without any virtual buffers. After placement, design memories that had the same names before placement and that have been mapped in different ways by the placement algorithm are renamed to different names, as described in more detail below with respect to steps 56 and 57 of FIG. 2. A post-placement memory model is then generated for each renamed memory in order to generate a precise timing model and a precise layout model. Virtual buffers are therefore not needed. The pre-placement memory model generation tool therefore presents the pre-placement layout models as virtual memories with dummy layouts and no virtual buffers.

4. Placement of Memories on the Slice

After the pre-placement memory models are generated, the universal memory tool begins memory placement. Memory placement can be performed automatically by a placement tool or manually by the designer. Any suitable memory placement algorithm can be used, and these algorithms can take into account information such as the memory layout models and the interconnections of the memories with other design elements. As a result of this algorithm execution, the placement tool provides the designer with a placement of all memories of the design.

As mentioned above, these memories can be mapped to RRAMs, SDMs, rcell memories and flip-flop rcell memories. In one embodiment, the designer is allowed to move one or more of these memories manually using the corresponding GUI for the memory placement algorithm.

5. Tiling Memories to SDMs and Rcells

Once the memory instances have been mapped to the slice, a tiling algorithm tiles the memories that were mapped to single diffused memories and rcell memories. For each of these memories, the tiling algorithm generates a memory netlist that contains flip-flops, rcells and/or single diffused memories.

Figure 4:
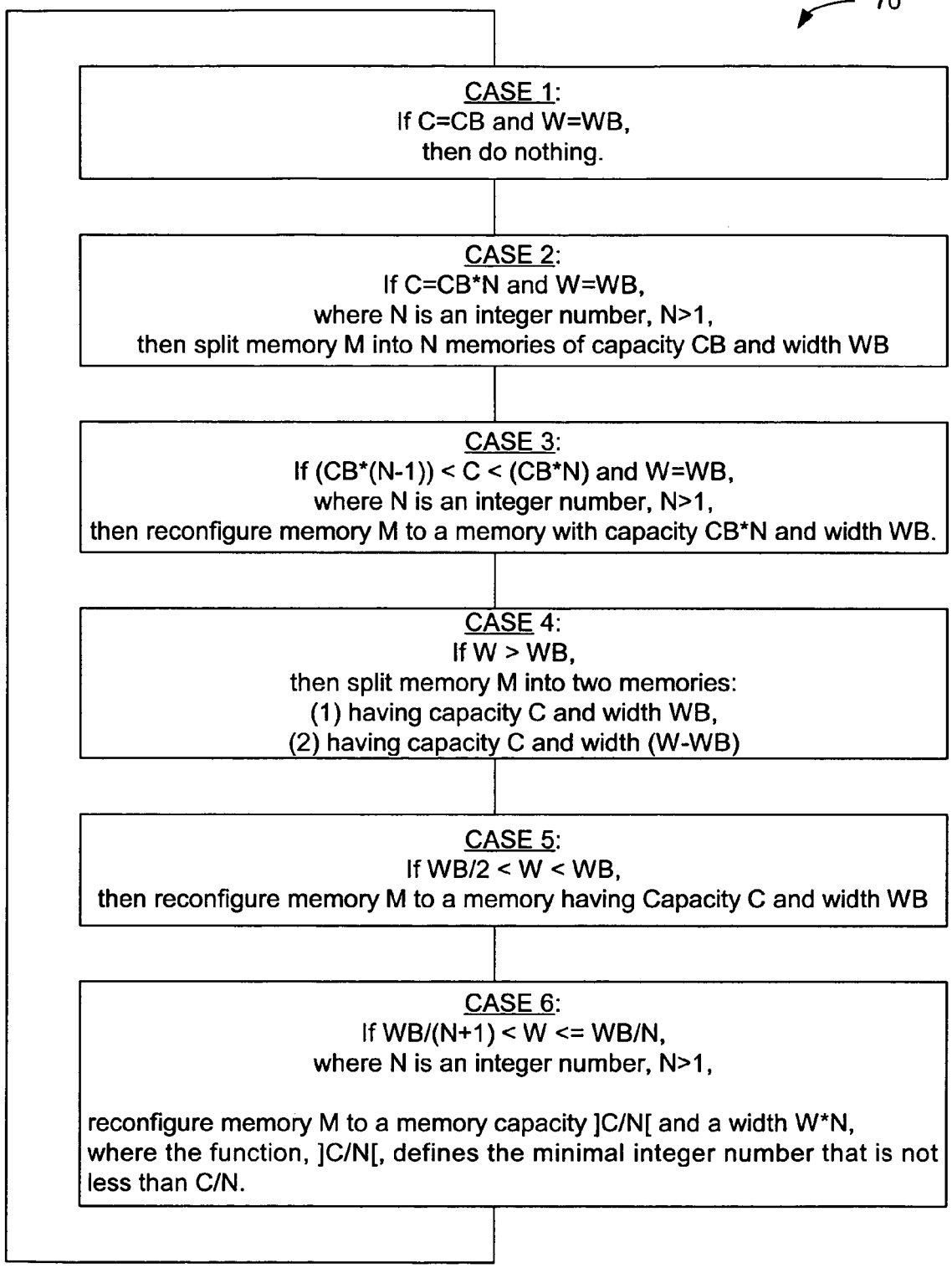
FIG. 4 is a flow chart illustrating a tiling algorithm.

FIG. 4 is a flow chart illustrating a tiling algorithm according to one embodiment of the present invention. Tiling algorithm 70 is recursive, and is performed for each memory that has been mapped to a rcell memory or an SDM memory. Although tiling algorithm 70 may not obtain the minimum possible number of rcell (or single diffused) memories in the tiling netlist, the algorithm can lead to better timing characteristics of the obtained tiling netlist, because it is able to use a minimum number of logic cells.

Let "M" be some design memory with a capacity (number of words) "C" and width (number of bits) "W", and let "MB" some rcell (or single diffused) memory on the slice with capacity "CB" and width "WB". On each step of the recursion, tiling algorithm 70 takes some memory M, reconfigures this memory or splits this memory into several parts, and then applies the tiling algorithm to obtained reconfigured memory or obtained parts of the memory. One embodiment of tiling algorithm 70 considers six cases of recursion, which are illustrated in FIG. 4 and can be applied in the order shown in FIG. 4 or in any other order.

Figure 5A:
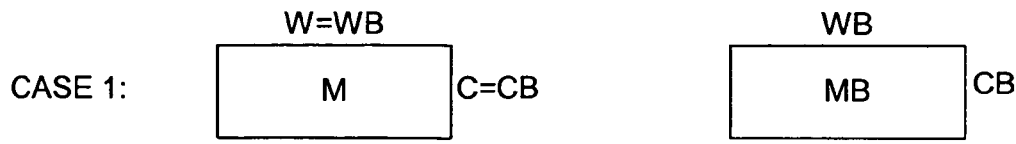
FIGS. 5A-5F are diagrams which illustrate examples of cases considered by the tiling algorithm shown in FIG. 4.

FIGS. 5A-5F are diagrams which illustrate examples of cases 1-6, respectively. In each figure, the dimensions of the design memory under consideration is shown relative to the dimensions of the rcell or SDM memory to which it is mapped, together with the resulting split or reconfiguration of memory M. Referring to case 1, FIG. 5A illustrates a memory M having a capacity C=CB and W=WB. In this case, memory M is not split or reconfigured during the present recursion step since the dimensions of memory M are the same as slice memory MB.

Figure 5B:
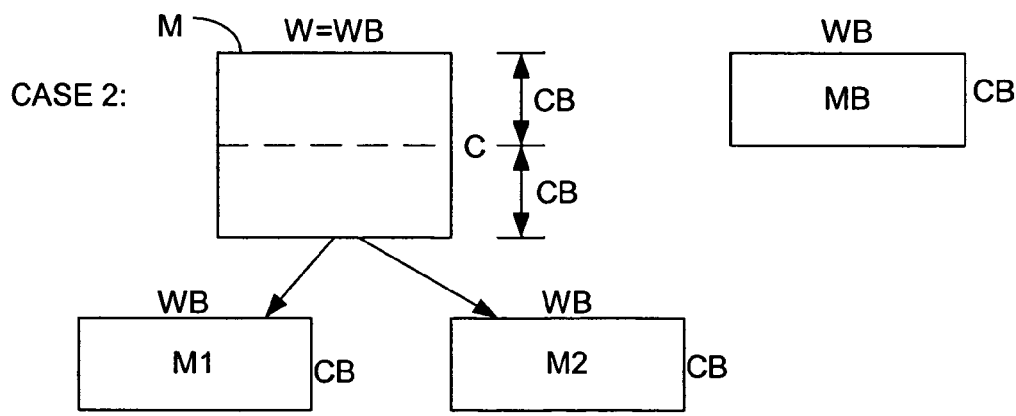

Referring to case 2, FIG. 5B illustrates a memory M having a capacity C=CB*N and a width W=WB, where N is an integer number and N>1. FIG. 5B illustrates the particular example where N=2. In this case, tiling algorithm 70 splits memory M into N memories of capacity CB and width WB. In the particular example shown in FIG. 5B, memory M is split into memories M1 and M2.

Figure 5C:
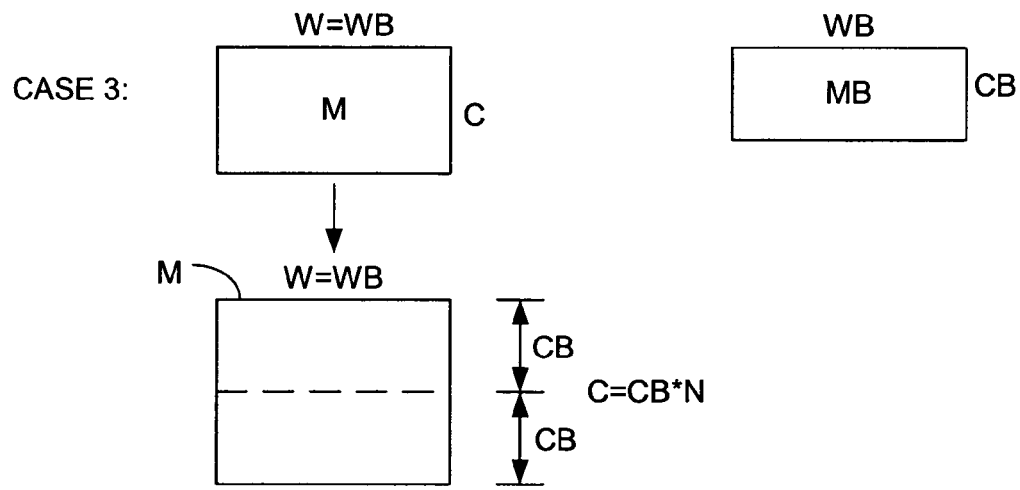

Referring to case 3, FIG. 5C, illustrates a memory M having (CB*(N−1))<C<(CB*N) and W=WB, where N is an integer number, N>1. FIG. 5B illustrates the particular example where N=2. The tiling algorithm reconfigures memory M to a memory having capacity CB*N and width WB.

Figure 5D:
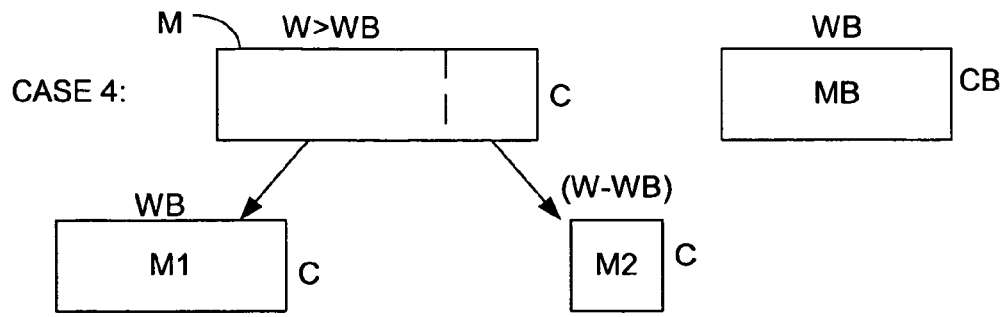

Referring to case 4, FIG. 5D illustrates a design memory M having a width W, where W>WB. The tiling algorithm splits memory M into two memories, M1 and M2. The first memory M1 has a capacity C and a width WB such that the first memory M1 can fit within one of the slice memory locations MB. The second memory M2 has a capacity C and a width (W−WB). The second memory M2 may also fit within one of the slice memory locations MB, depending on a value of "C". The value of C can be evaluated for the resulting memory M2 during another recursion step.

Figure 5E:
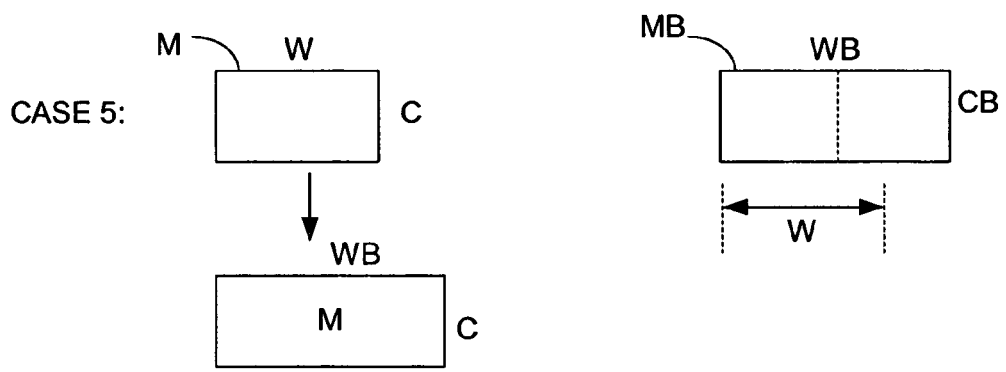

Referring to case 5, FIG. 5E illustrates a design memory M having a width W, where WB/2<W<WB. The tiling algorithm reconfigures memory M into a memory having capacity C and a width WB.

Figure 5F:
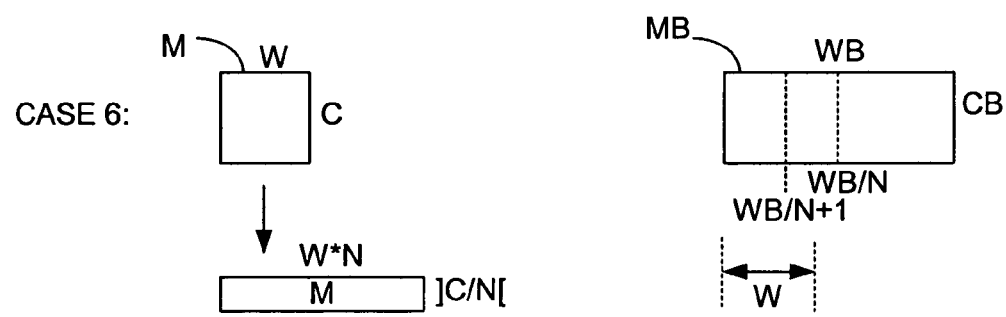

Referring to case 6, FIG. 5F illustrates a design memory having a width W, where WB/(N+1)<W<=WB/N, where N is some integer number, N>1. The tiling algorithm reconfigures memory M to a memory having a capacity "]C/N[" and a width "W*N". The function "]C/N[" defines the minimal integer number that is not less than C/N. In the particular example shown in FIG. 5F, N=2. Thus, the width of memory M can be expanded to better fit the slice memory width WB, while the capacity of memory M is reduced by a similar amount.

After each memory M is reconfigured or split according to cases 1-6, the resulting memories are passed through the tiling algorithm again for further reconfiguration or division. Once all memories M have a capacity C=CB and W=WB (case 1) the tiling algorithm terminates. The tiling algorithm therefore reduces the memories that are mapped into rcell memories and SDM memories to the configuration of the rcell memory or the configuration of the SDM memory.

All memories have then been successfully mapped to RRAMs, SDMs or rcell/flip-flop rcell memories.

6. Dis-Unification of Memory Netlist

Referring back to FIG. 2, once all design memories have been placed and tiled according to steps 54 and 55, the designer executes a dis-unification algorithm on the resulting memory netlist in which some memory modules of the netlist are renamed, at step 56. This algorithm is performed by a memory dis-unification tool that can be a subcomponent of the overall universal memory tool 50 or a separate design tool. The goal of this algorithm process is to set different names to the memories of the design that previously had the same names before placement and had been mapped in different ways by the placement algorithm.

The memory dis-unification tool has an input for receiving the list of design memories, wherein each type of design memory in the list has a pre-placement name, such as those shown in FIGS. 3A and 3B. The memory dis-unification tool is adapted to receive post-placement mapping information from the placement algorithms and rename those design memory instances in the list that are mapped differently than other instances of the same type, based on a comparison of the post-placement mapping information.

For example, the different instances of one design memory type that are mapped to RRAM matrices, may be presented using smaller memories of different numbers of words and bits, depending on which RRAM is used for memory mapping. Thus, the numbers of words and bits of the design memory are not changed, but these customer memories may be built from different smaller memories (like "bricks") and can therefore have different mapping information.

With respect to single diffused memories and rcells, these memories can be reconfigured and/or split in various combinations, so instances of a particular memory type might have unique pin placements, layouts, number of words, bits per word or arrangement.

Referring to the edited memory table shown in FIG. 3B, if during placement, two instances of type "Memory_B" are mapped with identical reconfigurations or with no reconfigurations (this is also the identical reconfiguration) then both instances may have the same name ("Memory_B") after dis-unification. In an alternative embodiment, both instances can be renamed to different names (such as "Memory_B_1" and "Memory_B_2") after dis-unification.

If two instances are reconfigured in different ways, then after dis-unification they will be renamed to different names (such as "Memory_B_1" and "Memory_B_2") after dis-unification.

Although the dis-unification algorithm renames some of the design memories, this operation can be performed as a virtual split that can be hidden from the designer. The resulting modified memory table and netlist are then used for generating separate memory models as described in more detail below.

7. Generating Post-Placement Memory Models

After memory dis-unification, the designer runs a post-placement memory model generation tool, at step 57 in FIG. 2, for generating respective models for each of the dis-unified memories. The post-placement memory model generation tool is able to generate more precise timing and layout models for each of the memories since a separate model is generated for each dis-unified memory. Since each dis-unified memory has a separate name, it is no longer necessary to utilize common timing and layout models for memories of the same configuration, even though those memories may be mapped differently on the slice.

In one embodiment, the post-placement memory model generation tool generates a "precise timing model" for each dis-unified memory. The term "precise timing model" means that the timing model of the given memory is not a timing model of the "worse case" as was used in the pre-placement models in step 53. Rather, this timing model precisely describes the timing of the dis-unified memory for the particular mapping of this memory to the RRAM, SDM or rcell memories.

The post-placement memory model generation tool also generates a "precise layout model" in which the layout (outline and pin coordinates) of the dis-unified memory strictly correspond to the actual mapping of the memory to the slice. For example, if a dis-unified memory is mapped to a particular location of a particular RRAM, then the outline of this dis-unified memory and the pin positions of this dis-unified memory will be created to closely match the pin positions of the particular RRAM location.

By dis-unifying the memory netlist, it possible to give different names to different memories of the design. Thus, each memory may have its own timing and layout model based on the final placement of the memory. Consequently, the timing and layout models obtained by the universal memory algorithm are more precise than the model based on the worst cased mapping characteristics.

In addition, since each dis-unified memory has an accurate layout model with accurate pin positions, there is no need for the algorithm to use virtual buffers. 8. Physical Optimization of the Netlist After the placement of the design memories and the generation of the post-placement models, the designer can execute a further algorithm to physically optimize the netlist. A variety of different optimization tools can be used in alternative embodiments of the present invention. The tool that processes the physical optimization is provided with the locations of the dis-unified memories by the memory placement tool.

9. Exemplary Computing Environment

Figure 6:
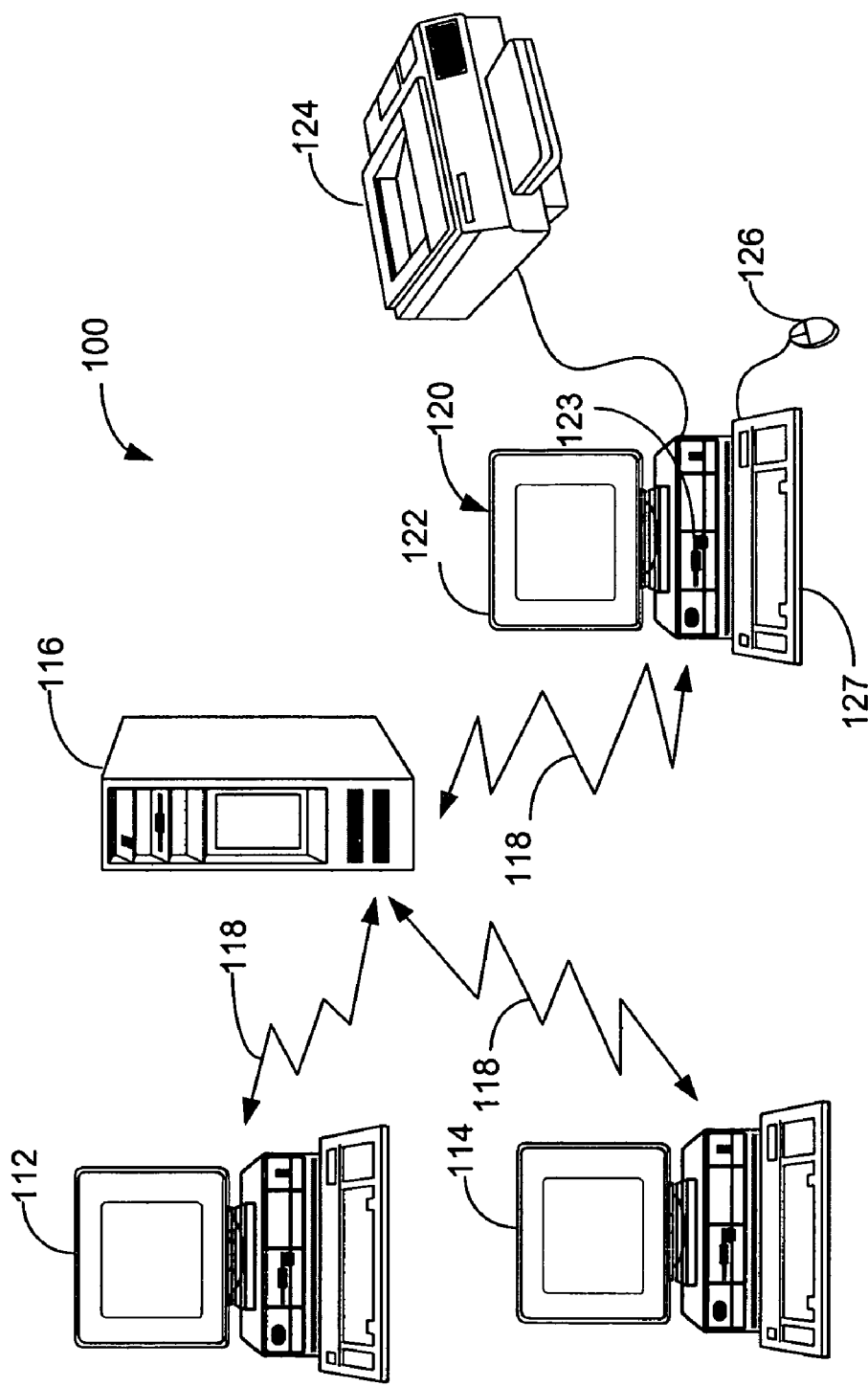
FIG. 6 illustrates an exemplary computer system upon which one or more design tools for implementing an embodiment of the present invention could be installed or used.

FIG. 6 illustrates an exemplary computer system 100 upon which one or more design tools for implementing an embodiment of the present invention could be installed or used.

Computer system 100 is illustrated as a networked computer system that includes one or more client computers 112, 114 and 120 such as workstations coupled through a network 118 to a server 116. Server 116 could also be a personal computer, a workstation, a midrange computer, or a mainframe computer. Network 118 represents any type of networked interconnection including but not limited to local-area, wide-area, wireless, and public networks such as the Internet or an Intranet.

Computer 120 may represent practically any type of computer, computer system, or other programmable electronic device, including a client computer similar to computers 112, 114 and 120 of FIG. 6, a server computer, e.g., similar to server 116 of FIG. 6, a portable computer, an embedded controller, a hand-held device, etc. Computer 120 may be coupled in a network as shown in FIG. 6 or may be a stand-alone device.

Computer 120 typically receives a number of inputs and outputs for communicating information externally. For interface with a user or operator, computer 120 typically includes one or more user input devices 126, 127, e.g., a keyboard, a mouse, a trackball, a joystick, a touchpad, and/or a microphone, among others, and a display 122 such as a CRT monitor, an LCD display panel, and/or a speaker, among others. For additional storage, computer 120 may also include one or more storage devices 123, e.g., a floppy or other removable disk drive, a hard disk drive, a direct access storage device, an optical drive, e.g., a CD drive, a DVD drive, etc., and/or a tape drive, among other computer-readable mediums, that may be connected directly or may be connected through a storage area network (SAN) or other network. Furthermore, computer 120 may include an interface connected to one or more networks 118, e.g., a local-area network, a wide-area network, a wireless network, and/or the Internet, among others, to permit communication of information with other computers coupled to the network.

Figure 7:
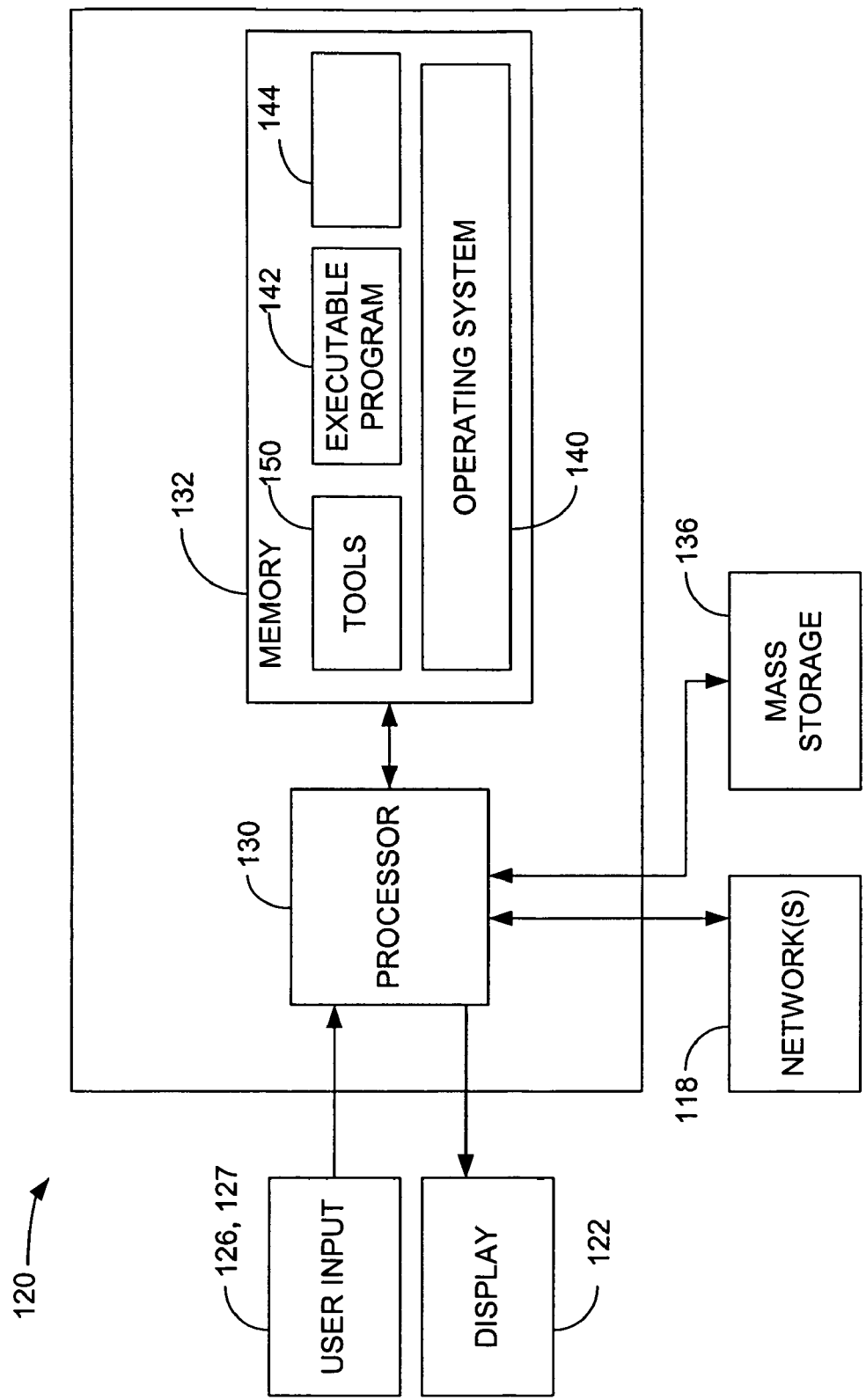
FIG. 7 is a block diagram of a computer upon which the methods and apparatus of various embodiments of the present invention can be installed, fully or partly, as one or more applications.

FIG. 7 is a block diagram of computer 120 upon which the methods and apparatus of various embodiments of the present invention can be installed, fully or partly, as one or more applications.

Computer 120 typically includes at least one processor 130 coupled to a memory 132. Processor 130 may represent one or more processors or microprocessors and memory 132 may represent the random access memory (RAM) devices comprising the main storage of computer 130, as well as any supplemental levels of memory such as cache memories, nonvolatile or backup memories, programmable or flash memories, read-only memories, etc. In addition, memory 132 may be considered to include memory storage physically located elsewhere in computer 130, e.g., any storage capacity used as a virtual memory, e.g., as stored on a mass storage device 36 coupled to computer 120 with a SAN or on another computer coupled to computer 120 via network 18.

Computer 120 may operate under the control of any suitable operating system 140. Operating system 140 typically executes various computer software applications, components, programs, objects, modules, etc., such as an executable program 142 and/or other components 144. Although the design tools 150 used to implement one or more embodiments of the present invention may be in memory 132 for the purpose of developing an integrated circuit, they need not be. The processor 130 may access the tools, the required data, other various applications components, programs, objects, modules, etc., resident on one or more processors in another computer coupled to computer 120 via a network 118, e.g., in a distributed or client-server computing environment whereby the processing to implement the functions of the memory allocation tool may be allocated to multiple computers over a network.

In general, the various tools 150 executed to implement one or more of the embodiments of the invention are referred to as design tools, whether implemented as part of an operating system or a specific application, database, component, program, object, module or sequence of instructions. The design tools typically comprise one or more instructions or databases that are resident at various times in various memory and storage devices in a computer, and that, when read and executed by one or more processors in a computer network, cause that computer to perform the instructions and/or process the databases embodying the various aspects of the invention. Examples of computer readable media on which such instructions can be stored include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links. The exemplary environments illustrated in FIGS. 6 and 7 are not intended to limit the present invention.

Although the present invention has been described with reference to preferred embodiments, workers skilled in the art will recognize that changes may be made in form and detail without departing from the spirit and scope of the invention. For example, the method and apparatus for tiling memories can be used for tiling other objects in integrated circuit layout patterns and in other non-IC layout patterns.

What is claimed is:

1. A process of tiling objects in object locations in an integrated circuit layout pattern, the process comprising:
    (a) for each object, recursively performing at least one of the following steps on the object based on a comparison of at least one of a capacity and a width of the object and that of a respective one of the object locations, wherein each of the object locations corresponds to a predefined feature on a base platform slice to which one or more of the objects can be mapped:
        (1) do nothing;
        (2) reconfigure the object to have a different capacity and/or width; and
        (3) split the object into two or more separate objects; and
    (b) repeating step (a) for each reconfigured object and each separate object generated in steps (a)(2) and (a)(3).

2. The process of claim 1 and further comprising:
    (c) mapping each separate object generated in step (a)(3) to a respective one of the object locations in the layout pattern.

3. The process of claim 1 wherein:
    the object has a capacity C and a width W;
    the respective one object location has a capacity CB and a width WB; and
    step (a)(1) comprises, if C=CB and W=WB, do nothing.

4. The process of claim 1 wherein:
    the object has a capacity C and a width W;
    the respective one object location has a capacity CB and a width WB; and
    step (a)(3) comprises, if C=CB*N and W=WB, where N is an integer number greater than one, split the object into N separate objects of capacity C=CB and width W=WB.

5. The process of claim 1 wherein:
the object has a capacity C and a width W;
the respective one object location has a capacity CB and a width WB; and
step (a)(2) comprises, if (CB*(N−1))<C<(CB*N) and W=WB, where N is an integer number greater than one, reconfigure the object to an object having capacity C=CB*N and a width W=WB.

6. The process of claim 1 wherein:
the object has a capacity C and a width W;
the respective one object location has a capacity CB and a width WB; and
step (a)(3) comprises, if W>WB, split the object into two separate objects, including a first object having the capacity C of the object prior to splitting, and a width W=WB and a second object having the capacity C of the object prior to splitting and a width (W−WB).

7. The process of claim 1 wherein:
the object has a capacity C and a width W;
the respective one object location has a capacity CB and a width WB; and
step (a)(2) comprises, if WB/2<W<WB, reconfigure the object into an object having the capacity C of the object prior to reconfiguration and a width W=WB.

8. The process of claim 1 wherein:
the object has a capacity C and a width W;
the respective one object location has a capacity CB and a width WB; and
step (a)(2) comprises, if WB/(N+1)<W<=WB/N, where N is an integer number greater than one, reconfigure the object to an object having a capacity "]C/N[" and a width "W*N", wherein the "]C/N[" defines a minimal integer number that is not less than C/N.

9. The process of claim 1 wherein:
each of the objects corresponds to a design memory instance.

10. The process of claim 9 wherein:
the features are configurable to implement at least one of the following memory types: a single diffused memory, an rcell memory and an rcell flip-flop memory; and
steps (a) through (b) are performed for each of the design memory instances that is mapped to a single diffused memory type, an rcell memory type or an rcell flip-flop memory type.

11. A process of tiling design memories comprising:
(a) receiving a database of design memory instances that can be instantiated in a layout pattern comprising respective memory features;
(b) for each instance, recursively performing at least one of the following steps on the instance based on a comparison of at least one of a capacity and a width of the instance and that of the respective memory feature:
(1) do nothing;
(2) reconfigure the instance to have a different capacity and/or width; and
(3) split the instance into two or more separate instances; and
(c) repeating step (b) for each reconfigured instance and each separate instance generated in steps (b)(2) and (b)(3).

12. The process of claim 11 and further comprising:
(d) mapping each separate instance generated in step (b)(3) to a respective one of the memory features in the layout pattern.

13. The process of claim 11 wherein:
the instance has a capacity C and a width W;
a respective one of the memory features has a capacity CB and a width WB; and
step (b)(1) comprises, if C=CB and W=WB, do nothing.

14. The process of claim 11 wherein:
the instance has a capacity C and a width W;
a respective one of the memory features has a capacity CB and a width WB; and
step (b)(3) comprises, if C=CB*N and W=WB, where N is an integer number greater than one, split the instance into N separate instances of capacity C=CB and width W=WB.

15. The process of claim 11 wherein:
the instance has a capacity C and a width W;
a respective one of the memory features has a capacity CB and a width WB; and
step (b)(2) comprises, if (CB*(N−1))<C 21 (CB*N) and W=WB, where N is an integer number greater than one, reconfigure the instance to an instance having capacity C=CB*N and a width W=WB.

16. The process of claim 11 wherein:
the instance has a capacity C and a width W;
a respective one of the memory features has a capacity CB and a width WB; and
step (b)(3) comprises, if W>WB, split the instance into two separate instances, including a first instance having the capacity C of the instance prior to splitting, and a width W=WB and a second instance having the capacity C of the instance prior to splitting and a width (W−WB).

17. The process of claim 11 wherein:
the instance has a capacity C and a width W;
a respective one of the memory features has a capacity CB and a width WB; and
step (b)(2) comprises, if WB/2<W<WB, reconfigure the instance into an instance having the capacity C of the instance prior to reconfiguration and a width W=WB.

18. The process of claim 11 wherein:
the instance has a capacity C and a width W;
a respective one of the memory features has a capacity CB and a width WB; and
step (b)(2) comprises, if WB/(N+1)<W<=WB/N, where N is an integer number greater than one, reconfigure the instance to an instance having a capacity "]C/N[" and a width "W*N", wherein the "]C/N[" defines a minimal integer number that is not less than C/N.

19. A computer-readable medium comprising instructions which, when executed on a computer, perform the following steps:
(a) inputting a database of design memory instances;
(b) inputting a database comprising predefined features of a base platform slice to which the design memory instances can be mapped;
(c) for each design memory instance, recursively performing at least one of the following steps on the design memory instance based on a comparison of at least one of a capacity and a width of the design memory instance and that of a respective one of the predefined features:
(1) do nothing;
(2) reconfigure the design memory instance to have a different capacity and/or width; and
(3) split the design memory instance into two or more separate design memory instances; and (d) repeating step (c) for each reconfigured design memory instance and each separate design memory instance generated in steps (c)(2) and (c)(3).

20. The computer-readable medium of claim 19 wherein, in step (c), the design memory instance has a capacity C and a width W, the respective one predefined feature has a capacity CB and a width WB, and steps (c)(1)-(c)(3) further comprise:

if C=CB and W=WB, do nothing;

if C=CB*N and W=WB, where N is an integer number greater than one, split the design memory instance into N separate design memory instances of capacity C=CB and width W=WB;

if (CB*(N−1))<C<(CB*N) and W=WB, reconfigure the design memory instance to a design memory instance having capacity C=CB*N and a width W=WB;

if W>WB, split the design memory instance into two separate design memory instances, including a first design memory instance having the capacity C of the design memory instance prior to splitting, and a width W=WB and a second design memory instance having the capacity C of the design memory instance prior to splitting and a width (W−WB);

if WB/2<W<WB, reconfigure the design memory instance into a design memory instance having the capacity C of the design memory instance prior to reconfiguration and a width W=WB; and if WB/(N+1)<W<=WB/N, reconfigure the design memory instance to a design memory instance having a capacity "]C/N[" and a width "W*N", wherein the "]C/N[" defines a minimal integer number that is not less than C/N.

* * * * *